(12) United States Patent
Kloster et al.

(10) Patent No.: US 10,756,215 B2
(45) Date of Patent: Aug. 25, 2020

(54) SELECTIVE DEPOSITION UTILIZING SACRIFICIAL BLOCKING LAYERS FOR SEMICONDUCTOR DEVICES

(71) Applicant: Intel Corporation, Santa Clara, CA (US)

(72) Inventors: Grant Kloster, Lake Oswego, OR (US); Scott B. Clendenning, Portland, OR (US); Rami Hourani, Portland, OR (US); Szuya S. Liao, Portland, OR (US); Patricio E. Romero, Portland, OR (US); Florian Gstrein, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/271,226

(22) Filed: Feb. 8, 2019

(65) Prior Publication Data

US 2019/0189803 A1 Jun. 20, 2019

Related U.S. Application Data

(63) Continuation of application No. 15/527,288, filed as application No. PCT/US2014/071717 on Dec. 19, 2014, now Pat. No. 10,243,080.

(51) Int. Cl.
*H01L 29/78* (2006.01)
*H01L 29/66* (2006.01)
(Continued)

(52) U.S. Cl.
CPC ...... *H01L 29/7851* (2013.01); *H01L 21/0228* (2013.01); *H01L 21/28194* (2013.01);
(Continued)

(58) Field of Classification Search
CPC ......... H01L 21/28194; H01L 21/31058; H01L 21/31133; H01L 29/0649; H01L 29/0673;
(Continued)

(56) References Cited

U.S. PATENT DOCUMENTS 6,103,567 A * 8/2000 Shih ................. H01L 28/40
438/251
2005/0250285 A1* 11/2005 Yoon ................. H01L 21/84
438/283
(Continued)

FOREIGN PATENT DOCUMENTS

CN 101471291 7/2009
CN 103165462 6/2013
(Continued)

OTHER PUBLICATIONS

International Search Report and Written Opinion for International Patent Application No. PCT/US2014/071717 dated Oct. 7, 2015, 12 pgs.
(Continued)

*Primary Examiner* — Christine A Enad
(74) *Attorney, Agent, or Firm* — Schwabe, Williamson & Wyatt, P.C.

(57) ABSTRACT

Methods of selectively depositing high-K gate dielectric on a semiconductor structure are disclosed. The method includes providing a semiconductor structure disposed above a semiconductor substrate. The semiconductor structure is disposed beside an isolation sidewall. A sacrificial blocking layer is then selectively deposited on the isolation sidewall and not on the semiconductor structure. Thereafter, a high-K gate dielectric is deposited on the semiconductor structure, but not on the sacrificial blocking layer. Properties of the sacrificial blocking layer prevent deposition of oxide material on its surface. A thermal treatment is then performed to remove the sacrificial blocking layer, thereby
(Continued)

forming a high-K gate dielectric only on the semiconductor structure.

19 Claims, 8 Drawing Sheets

(51) Int. Cl.
| | |
|---|---|
| *H01L 29/51* | (2006.01) |
| *H01L 21/28* | (2006.01) |
| *H01L 21/3105* | (2006.01) |
| *H01L 21/311* | (2006.01) |
| *H01L 21/02* | (2006.01) |
| *H01L 29/06* | (2006.01) |
| *H01L 29/786* | (2006.01) |
| *H01L 21/31* | (2006.01) |
| *H01L 23/498* | (2006.01) |
| *H01L 21/32* | (2006.01) |
| *H01L 29/423* | (2006.01) |

(52) U.S. Cl.
CPC .... *H01L 21/3105* (2013.01); *H01L 21/31058* (2013.01); *H01L 21/31133* (2013.01); *H01L 21/32* (2013.01); *H01L 29/0649* (2013.01); *H01L 29/0673* (2013.01); *H01L 29/42368* (2013.01); *H01L 29/42392* (2013.01); *H01L 29/517* (2013.01); *H01L 29/66545* (2013.01); *H01L 29/66795* (2013.01); *H01L 29/785* (2013.01); *H01L 29/786* (2013.01); *H01L 29/78696* (2013.01); *H01L 21/02178* (2013.01); *H01L 21/02181* (2013.01); *H01L 23/49822* (2013.01); *H01L 23/49827* (2013.01); *H01L 23/49838* (2013.01)

(58) Field of Classification Search
CPC ......... H01L 29/42368; H01L 29/42392; H01L 29/517; H01L 29/66545; H01L 29/66795
See application file for complete search history.

(56) References Cited

U.S. PATENT DOCUMENTS

| | | |
|---|---|---|
| 2011/0024794 A1 | 2/2011 | Ko et al. |
| 2012/0037914 A1 | 2/2012 | VanHoucke et al. |
| 2012/0074386 A1 | 3/2012 | Rachmady et al. |
| 2012/0126307 A1* | 5/2012 | Wu ................... H01L 21/76232 257/321 |
| 2013/0032871 A1* | 2/2013 | Shin ...................... H01L 21/764 257/315 |
| 2013/0248999 A1* | 9/2013 | Glass ..................... H01L 29/36 257/335 |
| 2013/0270513 A1 | 10/2013 | Romero et al. |
| 2013/0279145 A1* | 10/2013 | Then .................. H01L 29/66431 361/820 |
| 2014/0015015 A1 | 1/2014 | Krivokapic et al. |
| 2014/0213048 A1* | 7/2014 | Sun ....................... H01L 29/401 438/592 |

FOREIGN PATENT DOCUMENTS

| | | |
|---|---|---|
| CN | 104217961 | 12/2014 |
| CN | 104218085 | 12/2014 |

OTHER PUBLICATIONS

International Preliminary Report on Patentability for International Patent Application No. PCT/US2014/071717 dated Jun. 29, 2017, 9 pgs.

Search Report for European Patent Application No. 14908638.1 dated Jun. 26, 2018, 10 pages.

Chen Rong et al., "Achieving area-selective atomic layer deposition on patterned substrates by selective surface modification," Applied Physics Letters, AIP Publishing LLC, US, vol. 86, No. 19, May 4, 2005 pp. 191910-191910.

Office Action from Chinese Patent Application No. 201480083547, dated Feb. 3, 2020, 9 pgs.

* cited by examiner

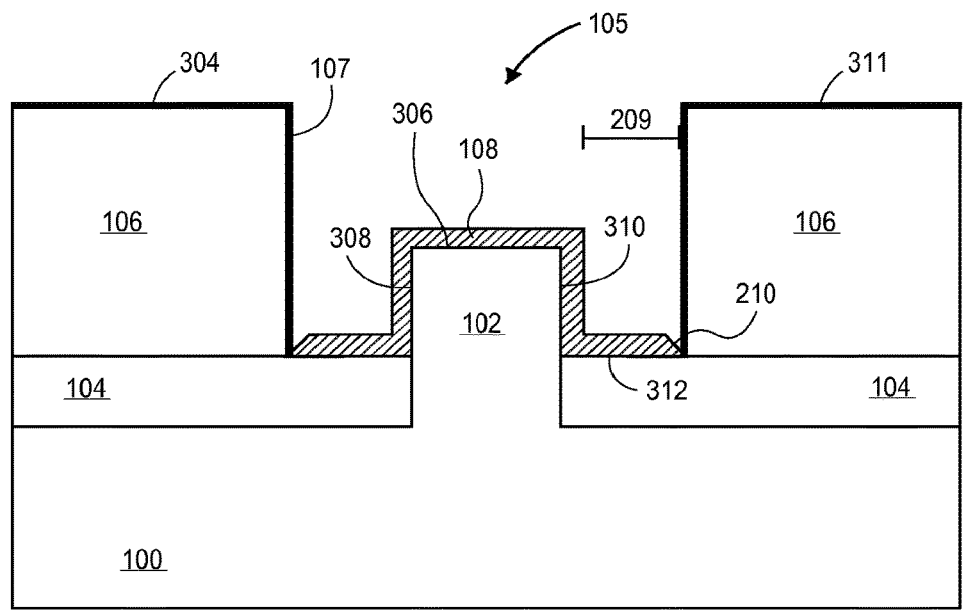
FIG. 4C
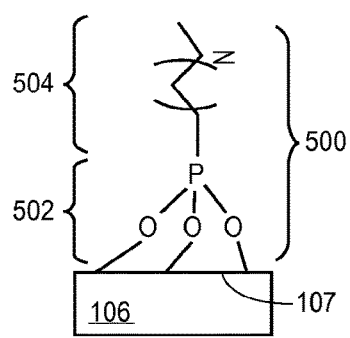 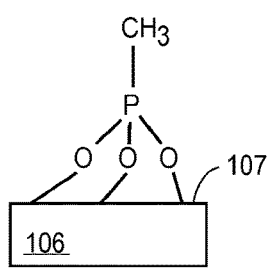 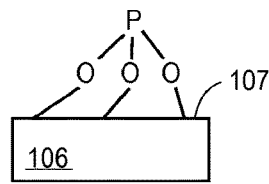 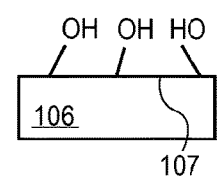
FIG. 5A    FIG. 5B    FIG. 5C    FIG. 5D

SELECTIVE DEPOSITION UTILIZING SACRIFICIAL BLOCKING LAYERS FOR SEMICONDUCTOR DEVICES

CROSS-REFERENCE TO RELATED APPLICATION

This patent application is a continuation of U.S. patent application Ser. No. 15/527,288, filed May 16, 2017, which is a U.S. National Phase Application under 35 U.S.C. § 371 of International Application No. PCT/US2014/071717, filed Dec. 19, 2014, entitled "SELECTIVE DEPOSITION UTILIZING SACRIFICIAL BLOCKING LAYERS FOR SEMICONDUCTOR DEVICES," which designates the United States of America, the entire disclosure of which are hereby incorporated by reference in their entirety and for all purposes.

TECHNICAL FIELD

Embodiments generally relate to semiconductor processes and, more specifically, selective deposition of oxide films by utilizing sacrificial blocking layers for semiconductor devices.

BACKGROUND

An ever-increasing demand for smaller, higher performance electronic devices has been the driving force behind the semiconductor industry to fabricate smaller semiconductor devices with increased performance. Performance of a semiconductor device is highly dependent upon the number of transistor devices fabricated on a semiconductor chip. For example, the performance of a central processing unit increases as the number of its logic devices increases. As the number of transistor devices increases, however, the amount of real estate occupied by the transistor devices also increases. Increasing the amount of occupied real estate increases the overall size of the chip. Thus, to minimize the size of the chip and maximize the number of transistor devices formed on the chip, industry leaders have developed ways to shrink the size of each transistor device. Shrinking transistor device size allows an increased number of transistor devices to be formed on a single semiconductor chip without significantly affecting available real estate.

BRIEF DESCRIPTION OF THE DRAWINGS

FIGS. 4A-4C illustrate a method of forming a high-K gate dielectric by utilizing a sacrificial blocking layer on an isolation layer and on a portion of a STI, in accordance with an embodiment of the invention.

FIG. 5A illustrates a molecular diagram of an intact molecule of an exemplary sacrificial blocking layer, in accordance with an embodiment of the invention.

FIGS. 5B-5D illustrate molecular diagrams of various dangling molecules of a decomposed sacrificial blocking layer, in accordance with embodiments of the invention.

DETAILED DESCRIPTION

Described herein are systems and methods of forming a semiconductor device by utilizing sacrificial blocking layers to selectively deposit high-K gate dielectric on semiconductor structures. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Techniques for minimizing transistor device size include gate end cap scaling. Gate end cap scaling involves the formation of smaller and smaller openings beside a channel region of a transistor device. The small openings are difficult to fill with gate materials, such as reliability layers and workfunction metals. For instance, space between a transistor gate fin and an isolation sidewall for a non-planar finFET transistor may be too small for proper fill of reliability layers and metal fill layers after deposition of a high-K gate dielectric, as observed in FIG. 1.

Figure 1:
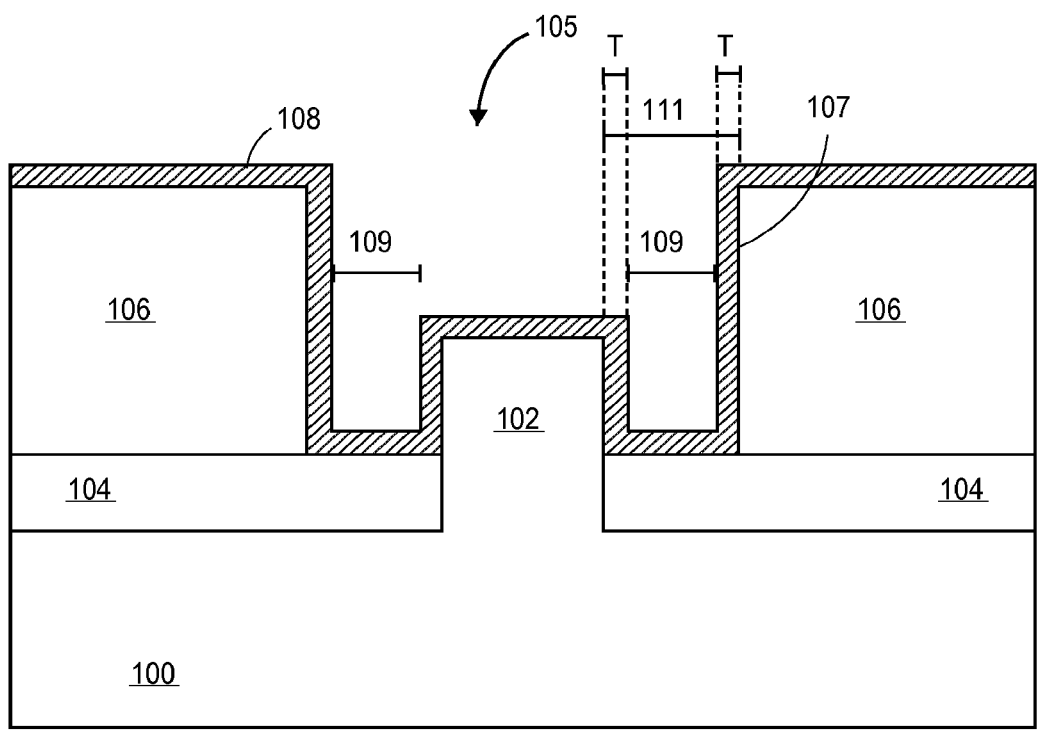
FIG. 1 illustrates a cross-sectional view of a high-K gate dielectric formed by conventional techniques.

FIG. 1 illustrates a typical high-K gate dielectric for a non-planar device, such as a finFET transistor, formed by conventional techniques. As shown, a substrate 100 with a fin 102 is provided. The fin 102 extends above a shallow trench isolation (STI) 104 formed on the substrate 100. An isolation layer 106 is disposed on top of the STI 104 and has isolation sidewalls 107 that are located a distance 111 away from the fin 102. A window 105 is formed within the isolation layer 106 to expose areas of the STI 104 and fin 102.

A high-K gate dielectric 108 is formed on at least a portion of exposed regions of the fin 102 to electrically isolate the fin 102 from a subsequently-formed gate electrode. Conventional techniques of forming the high-K gate dielectric 108 include conformally depositing the high-K gate dielectric 108 over at least a portion of the exposed regions of the fin 102, STI 104, and isolation layer 106. The distance 111 between the fin 102 and isolation sidewall 107 is decreased by the thickness T of the high-K gate dielectric 108. Because the high-K gate dielectric 108 is disposed on the isolation sidewall 107 as well as the fin 102, the distance 111 is significantly decreased by two times the thickness T of the high-K gate dielectric 108. In embodiments, available space 109 remains between the fin 102 and the isolation sidewall 107.

Significantly decreasing the distance 111 makes it more difficult to form a gate electrode over the fin 102 within the space 109. Due to the small available space 109, gate material, such as a workfunction material and a gate fill material, may not completely fill in the available space 109. Resulting gaps or voids in the available space 109 hinders device performance. Additionally, available space 109 may be too small to allow gate end-cap scaling.

According to an embodiment of the present invention, a method of forming a semiconductor device includes selectively depositing high-K gate dielectric on the fin, but not on the isolation sidewall, to maximize space available for deposition of gate electrode material. Specifically, the method utilizes a sacrificial blocking layer to prevent deposition of high-K gate dielectric from forming on the isolation sidewall. In an embodiment, the sacrificial blocking layer is a self-assembled monolayer (SAM), such as, but not limited to, octadecylphophonic acid (ODPA), 1-octadecanethiol (ODT), octadecyltrichlorsilane (ODTCS), and stearic acid (ODCA), that is composed of molecules having a large molecular structure. Each molecule may include a tail that is formed of at least 12 backbone atoms. In a particular embodiment, the tail is formed of approximately 18 backbone atoms. A high-K gate dielectric may then be deposited on the semiconductor structure. The large molecular structure of the SAM may prevent deposition of the high-K gate dielectric on surfaces of the isolation layer. Thereafter, the SAM is removed, leaving the high-K gate dielectric to remain on the semiconductor structure and not on the isolation layer. In an embodiment, the high-K gate dielectric has a dielectric constant greater than 10.

Embodiments of the present invention selectively deposit high-K gate dielectric on the semiconductor structure and not on the isolation layer. Selectively depositing high-K gate dielectric on the semiconductor structure increases the available space between the semiconductor structure and the isolation sidewalls and does not increase the overall size of the semiconductor device. As a result, the enlarged available space may enable proper gate formation as well as gate end-cap scaling. For instance, the method may enable formation of smaller gate end caps, which increases transistor density of the semiconductor chip. Additionally, the method also enables formation of transistors with smaller gate lengths, i.e., the distance between the source and drain regions. Forming transistors with smaller gate lengths also increases transistor density of the semiconductor chip. Increasing transistor density increases device performance.

Figure 2:
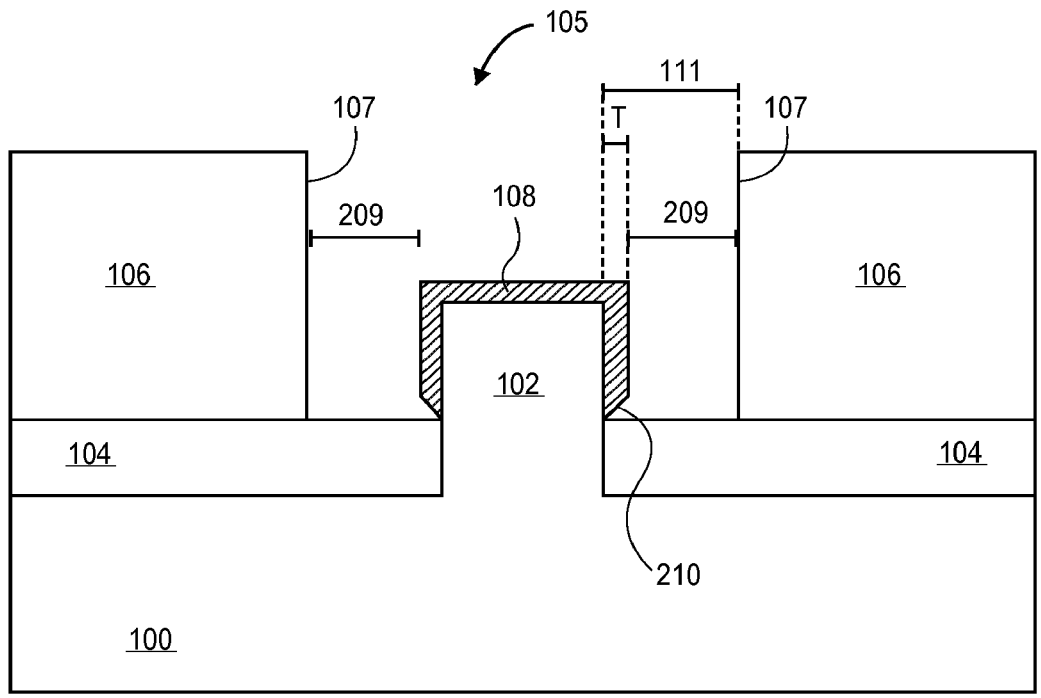
FIG. 2 illustrates a cross-sectional view of a high-K gate dielectric formed by a method utilizing a sacrificial blocking layer, in accordance with an embodiment of the invention.

FIG. 2 illustrates a high-K gate dielectric 108 formed only on a semiconductor structure 102, according to an embodiment of the invention. The semiconductor structure 102 may be a fin for a finFET transistor. In embodiments, the high-K gate dielectric 108 is not disposed on exposed surfaces of the isolation layer 106, such as isolation sidewalls 107. Because the high-K gate dielectric 108 is not disposed on the isolation sidewalls 107, the available space 209 is greater than the available space 109 formed by conventional methods. In an embodiment, the available space 209 is greater than the available space 109 by one thickness T of the high-K gate dielectric 108. For instance, if the thickness T is approximately 2 nm, the available space 209 is approximately 2 nm greater than the available space 109. In an embodiment, the ends 210 of the high-K gate dielectric 108 may be rounded or tapered due to the method of its formation, as will be discussed further herein.

FIGS. 3A-3E illustrate a method of forming a semiconductor device by selectively depositing high-K gate dielectric on a semiconductor structure. Embodiments disclosed herein illustrate a method of forming a tri-gate finFET transistor. Although embodiments illustrate a method of forming finFET transistors, the method may be implemented for other non-planar transistors as well, such as gate all-around transistors.

Figure 3A:
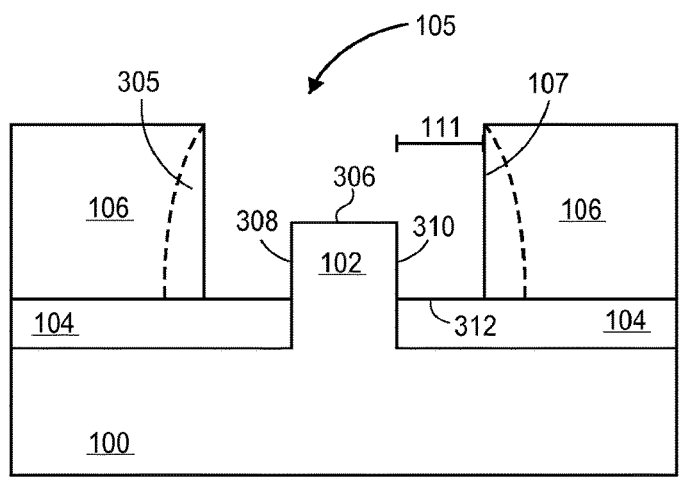
FIGS. 3A-3E illustrate cross-sectional and top-down views of a method of forming a high-K gate dielectric by utilizing a sacrificial blocking layer on an isolation layer, in accordance with an embodiment of the invention.

As illustrated in FIG. 3A, a substrate 100 is provided. The substrate 100 may be any suitable semiconductor substrate. For instance, the semiconductor substrate may be a crystalline substrate formed using a bulk silicon or a silicon-on-insulator substructure. Alternatively, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

In an embodiment, a fin 102 may extend from the substrate 100. For instance, the fin 102 may extend vertically upward from the substrate 100. In embodiments, the fin 102 and the substrate 100 form one monolithic structure. Accordingly, the fin 102 may be formed of the same material as the substrate 100. Any suitable anisotropic etch technique, such as a dry etch process, may be used to form the fin 102. For example, an anisotropic dry etch process may remove portions of the substrate 100 to form the fin 102.

STI 104 may be disposed on top of the substrate 100 and on opposite sides of the fin 102. The STI 104 may electrically isolate the semiconductor device from adjacent semiconductor devices. In an embodiment, the STI 104 has a top surface 312 that is below the top surface 306 of the fin 102 so that more than one surface of the fin 102, e.g., the top surface 306 and portions of the sidewalls 308 and 310, may be exposed. Any suitable insulating material may be used to form the STI 104. For instance, the STI 104 may be formed of various combinations of silicon oxides, silicon carbides, silicon nitrides, silicon oxynitrides, silicon oxycarbides, and silicon oxycarbonitrides. The STI 104 may be formed by an initial blanket deposition of oxide material followed by a planarization process and an etch process that recesses the STI below the top surface 306 of the fin 102.

In addition, an isolation layer 106 may be disposed above the substrate 100. In an embodiment, the isolation layer 106 is disposed on top of the STI 104. The isolation layer 106 may be a low-level isolation layer, such as a first interlayer dielectric (ILDO), in a semiconductor device for electrically isolating source/drain regions from higher-level routing lines. A window 105 may be formed within the isolation layer 106 to expose at least a portion of the fin 102 and the STI 104. In an embodiment, a portion of the top surface 312 of the STI 104 is exposed by the window 105. The isolation layer 106 may have isolation sidewalls 107 that are disposed a lateral distance 111 away from respective sidewalls 308 and 310 of the fin 102. The distance 111 may be determined based upon design requirements for maximizing the number of semiconductor devices on a semiconductor chip. For instance, the distance 111 may be less than approximately 14 nm.

Isolation layer 106 may be formed of a material having a different functionality than the fin 102. In an embodiment, the isolation layer 106 is formed of an insulating layer, such as various compositions of silicon oxides, silicon carbides, silicon nitrides, silicon oxynitrides, silicon oxycarbides, and silicon oxycarbonitrides. According to embodiments of the invention, the isolation layer 106 may be formed of a metal oxide, e.g., hafnium oxide (HfO2). The isolation layer 106 may also be formed of a chemically different material than the STI 104. In a particular embodiment, the isolation layer 106 is formed of a metal oxide and the STI 104 is formed of a silicon oxide.

In an embodiment, the isolation layer 106 may be deposited and a window 105 formed during a replacement gate process. A replacement gate process is generally a process by which a sacrificial gate is used as a place holder for a gate electrode. For instance, in an exemplary replacement gate process, a sacrificial gate, such as a polysilicon gate, is initially formed on the semiconductor structure 102 and source/drain regions are formed on opposite sides of the gate electrode by, for example, implanting dopants into the semiconductor structure 102. Thereafter, the isolation layer 106 may be formed around the sacrificial gate by blanket depositing isolation material and subsequently planarizing the deposited material. The isolation material may be deposited by any suitable deposition process, such as chemical-vapor deposition (CVD). The planarization process may be performed by a chemical-mechanical planarization process (CMP) to expose the sacrificial gate. The sacrificial gate may then be removed to form the window 105 by an etch process, such as a wet etch process.

In embodiments of the present invention, the window 105 is a cavity where a sacrificial gate was once located. The window 105 may define the location where gate electrode may subsequently be formed. In an embodiment, the isolation layer 106 further includes gate spacers 305 embedded within the isolation layer 106 at the isolation sidewall 107. The gate spacers 305 may be an artifact of the replacement gate process. For instance, after the sacrificial gate is formed, gate spacers 305 may be formed around the sacrificial gate. The source/drain regions may be implanted thereafter using the gate spacers 305 as an implant mask. Thus, after the isolation layer is deposited around the gate spacers 305 and the sacrificial gate is removed, the gate spacers 305 may remain within the isolation layer 106.

Figure 3B:
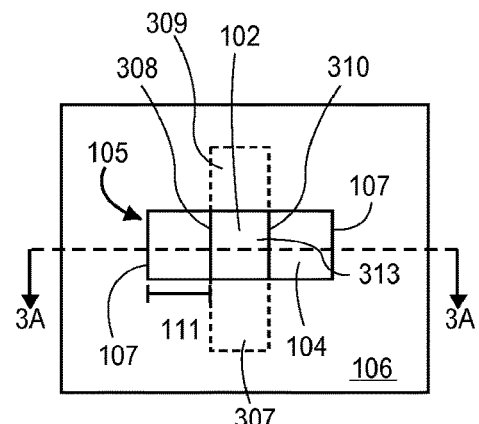

FIG. 3B, illustrates the top-down view of FIG. 3A. The window 105 may expose areas where a high-K gate dielectric and gate electrode will later form. For instance, the window 105 may expose a channel region 313 of the fin 102 and regions of the STI 104 adjacent to the channel region 313. Accordingly, source/drain regions 307 and 309 may be parts of the fin 102 that are covered by the isolation layer 106. The source/drain regions 307 and 309 may be electrically coupled to the channel region 313. Thus, when a gate electrode is formed within the window 105, the gate electrode may be disposed over the channel region 313 to form an inversion layer for conducting current between the source/drain regions 307 and 309 when the transistor is turned ON. The isolation sidewalls 107 may be lateral sidewalls of the window 105 that are set a distance 111 from the sidewalls 308 and 310 of the fin 102. A high-K gate dielectric, workfunction metal, and fill metal may be disposed within the window 105, as will be discussed further herein.

Figure 3C:
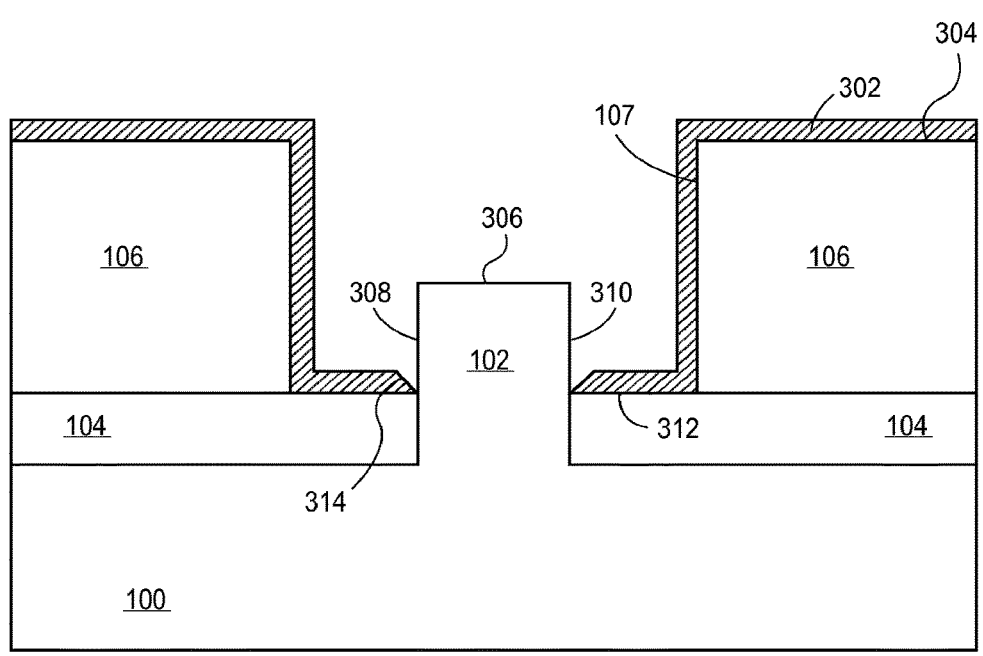

Next, in FIG. 3C, a sacrificial blocking layer 302 is selectively deposited on exposed oxide surfaces, according to embodiments of the invention. The sacrificial blocking layer 302 may be a protective layer that prevents deposition of oxide material on the exposed oxide surfaces. In an embodiment, the sacrificial blocking layer 302 is a self-assembled monolayer (SAM). The SAM may be a molecular assembly organized into ordered domains on the exposed oxide surfaces. Each molecule of the SAM may include a head group and a tail, where the head group anchors the molecule to the oxide surface and the tail prevents oxide material from depositing on the oxide surface. The molecular structure of such molecules will be discussed further with respect to FIG. 5A. In embodiments, the sacrificial blocking layer 302 is formed of a molecule containing a head group that preferentially anchors to oxide surfaces. For example, the sacrificial blocking layer 302 may be formed of molecules such as, but not limited to, octadecylphophonic acid (ODPA), 1-octadecanethiol (ODT), octadecyltrichlorsilane (ODTCS), or stearic acid (ODCA). These molecules may be formed from phosphonic acids, thiols, carboxylic acids, amines, amino-silanes, chloro-silanes, or alkoxy-silanes. In an embodiment, the sacrificial blocking layer 302 is formed of ODPA, which preferentially attaches to an isolation layer 106 formed of HfO2.

According to embodiments of the invention, the molecules that form the sacrificial blocking layer 302 have a large molecular size. Specifically, the tail of the molecule is formed of at least 12 backbone atoms, such as 12 carbons. In a particular embodiment, the tail of the molecule is formed of approximately 18 backbone atoms. The large molecular structure of the SAM may prevent deposition of oxide materials on its surface.

The sacrificial blocking layer 302 may be deposited by a solution-phase process or vapor-phase epitaxy. For example, the sacrificial blocking layer 302 may be deposited by a solution-phase process under a proper processing environment, such as a balance of acid concentration, solution temperature, and passivation time. In an embodiment, a balanced processing environment includes ODPA, ODT, ODTCS, or ODCA with a concentration between 1 to 5 mM, a solution temperature between room temperature to 100° C., and/or a passivation time between 1 to 24 hours.

In an embodiment, the sacrificial blocking layer 302 is disposed on the isolation layer 106, isolation sidewalls 107, and a top surface 312 of the STI 104. The sacrificial blocking layer 302 may be formed on both the isolation layer 106 and STI 104, regardless of whether the isolation layer 106 and the STI 104 are formed of the same materials. For instance, the sacrificial blocking layer 302 may be formed on both the isolation layer 106 and STI 104 when the isolation layer 106 and STI 104 are formed of the same oxide material. Additionally, the sacrificial blocking layer 302 may be formed on both the isolation layer 106 and STI 104 even though the isolation layer 106 and STI 104 are formed of different oxide materials. Alternatively, however, the sacrificial blocking layer 302 may not be formed on the STI 104 in instances where the isolation layer 106 is formed of a different oxide material than the STI 104, as will be discussed further below.

The sacrificial blocking layer 302 may have a thickness of approximately 1-2 nm depending on the molecular size of the molecules that form the sacrificial blocking layer 302. In embodiments, the sacrificial blocking layer 302 may have a uniquely structured end 314. For instance, the ends 314 may be a surface that is not perpendicular to the top surface 312 of the STI 104. In an embodiment, the unique ends 314 have a curved or tapered profile. For instance, the sacrificial blocking layer 302 may gradually become thinner toward the farthest ends of the sacrificial blocking layer 302. In an embodiment, the outer surface of the sacrificial blocking layer 302 slopes toward the STI 104 to produce the gradual thinning of the sacrificial blocking layer 302. Structural confinement at the corner of the fin 102 and the STI 104, as well as structural discrepancies related to selective deposition on oxide surfaces, may cause the sacrificial blocking layer 302 to have the uniquely structured end 314. In other embodiments, however, the ends 314 do not have a unique structure, but have a vertical, flat end 314.

Figure 3D:
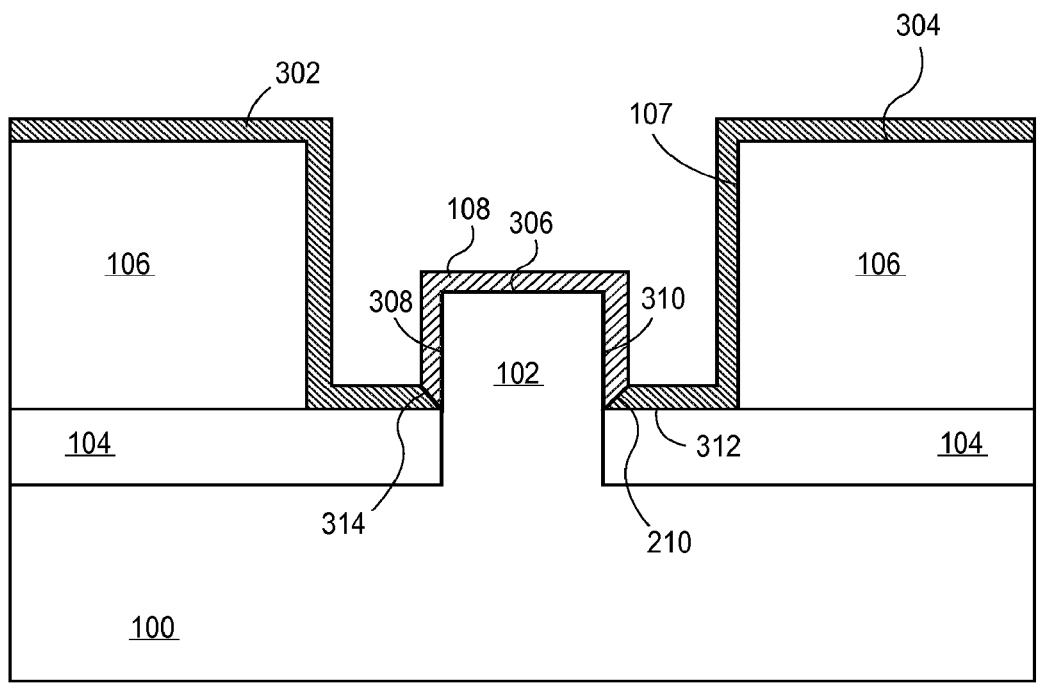

Once the sacrificial blocking layer 302 is formed, a high-K gate dielectric 108 may then be deposited as illustrated in FIG. 3D. The high-K gate dielectric 108 may be deposited by any suitable deposition process such as CVD or atomic layer deposition (ALD). In an embodiment, high-K gate dielectric 108 is formed by a deposition process as opposed to a growth process, thus the underlying structure, such as the fin 102, may not be consumed when the high-K gate dielectric 108 is formed. The fin 102 may remain substantially intact following deposition of the high-K gate dielectric 108. In embodiments where the sacrificial blocking layer 302 is formed of a SAM, the sacrificial blocking layer 302 may be sensitive to high temperatures. For instance, the sacrificial blocking layer 302 may thermally decompose when exposed to a certain temperature (i.e., a decomposition temperature). Accordingly, the high-K gate dielectric 108 may be deposited by a low temperature deposition process that deposits the high-K gate dielectric 108 at a temperature lower than the decomposition temperature of the sacrificial blocking layer 302. In an embodiment, the decomposition temperature is between 200° C. to 400° C. Thus, in such an embodiment, the high-K gate dielectric 108 is deposited at a temperature lower than 200° C. In some instances, however, the high-K gate dielectric 108 may be deposited at a temperature within the decomposition temperature range. The rate at which the sacrificial blocking layer 302 breaks down may be dependent upon the decomposition temperature. Higher decomposition temperatures may cause a higher rate of decomposition when compared to that of lower decomposition temperatures. Thus, depositing the high-K gate dielectric 108 at a lower decomposition temperature range may still be practically feasible without significantly breaking down the sacrificial blocking layer 302. For instance, the high-K gate dielectric 108 may be deposited at a temperature lower than 250° C. such that the molecular decomposition of the sacrificial blocking layer 302 is limited and the blocking capabilities are maintained.

In a specific embodiment, the high-K gate dielectric 108 is deposited by a low temperature ALD process. The low temperature ALD process may be performed at an oxide deposition temperature less than 250° C. One example of the low temperature ALD process includes introducing a metal-containing precursor, such as hafnium tetra(methylamine), into a process chamber. The precursor may react with a desired surface, e.g., absorb into a surface of the fin 102, to form a single atomic monolayer. The precursor may not react any further once the single atomic monolayer is formed. Thereafter, the chamber may be purged with an inert gas, and a co-reactant precursor, such as water, may then be introduced. The co-reactant may react with the surface-absorbed metal-containing precursor to form a new surface-absorbed species. For example, water may react with hafnium amine groups to release dimethylamine and form hydroxyl-terminated hafnium molecules on the surface of the fin 102. Any other suitable co-reactant, such as zirconium-amide or titanium-amide may be used. Additionally, organometallic variants with cyclopentadienyl moieties or metal alkoxides may also be used.

Next, the chamber may be purged and the metal-containing precursor may be introduced again, this time reacting with the newly formed surface-absorbed species to form another single atomic monolayer. The process may continue by alternating pulses of the metal-containing precursor and co-reactant, with inter-gas purges between the pulses to prevent gas-phase reactions, until the desired number of mono-layers is achieved to form a high-K gate dielectric 108 with a desired thickness. The high-K gate dielectric 108 may be formed to any suitable thickness sufficient for device operation as designed. For instance, the high-K gate dielectric 108 may be 1 to 2 nm thick. Each of these processes may be performed at a temperature that substantially maintains the sacrificial blocking layer 302. In an embodiment, each processes may be performed at a temperature lower than 250° C. Accordingly, the sacrificial blocking layer 302 remains substantially intact following deposition of the high-K gate dielectric 108.

In embodiments, the high-K gate dielectric 108 may include one layer or a stack of layers of high-K dielectric material. The high-K dielectric material may include elements such as hafnium, silicon, oxygen, titanium, tantalum, lanthanum, aluminum, zirconium, barium, strontium, yttrium, lead, scandium, niobium, and zinc. Examples of high-K materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, zirconium oxide and lead zinc niobate. In an embodiment, the high-K gate dielectric 108 is formed of a high-K dielectric capable of being formed under low (e.g., approximately 250° C.) process temperatures. For instance, the high-K gate dielectric 108 may be formed of hafnium oxide or zirconium oxide. In some embodiments, an annealing process may be carried out on the gate dielectric layer to improve its quality when a high-K material is used. The high-K gate dielectric may be formed of a material having a dielectric constant greater than 8.

During deposition of the high-K gate dielectric 108, the sacrificial blocking layer 302 prevents deposition of the high-K gate dielectric 108 on covered oxide surfaces, such as surfaces of the isolation layer 106 and the STI 104. The size of the molecules that form the sacrificial blocking layer 302 may prevent the high-K gate dielectric 108 from forming on the sacrificial blocking layer 302. Accordingly, the high-K gate dielectric 108 may be selectively formed on the top surface 306 and portions of the sidewalls 308 and 310 of the fin 102, and not on the sacrificial blocking layer 302.

As illustrated in FIG. 3D, the high-K gate dielectric 108 may make contact with the unique ends 314 of the sacrificial blocking layer 302. Although the high-K gate dielectric 108 is not formed directly on the unique ends 314, the profile of the unique ends 314 may affect the resulting profile of the ends 210 of the high-K gate dielectric 108. For instance, the ends 210 may be curved or tapered. The curved or tapered ends 210 may be caused by forming against the unique ends 314 of the sacrificial blocking layer 302. As the high-K gate dielectric 108 forms on the surfaces 308 and 310, the high-K gate dielectric 108 may touch the unique ends 314. Touching the unique ends 314 during formation causes the ends 210 of the high-K gate dielectric 108 to have a corresponding unique profile that is not perpendicular to the sidewalls 308 and 310. Alternatively, in embodiments where the ends 314 of the sacrificial blocking layer 302 do not have a unique profile (e.g., perpendicular to the isolation sidewall 107), the corresponding ends 210 of the high-K gate dielectric 108 do not have a unique profile either. For instance, the ends 210 of the high-K gate dielectric 108 may be perpendicular to the sidewalls 308 and 310.

Figure 3E:
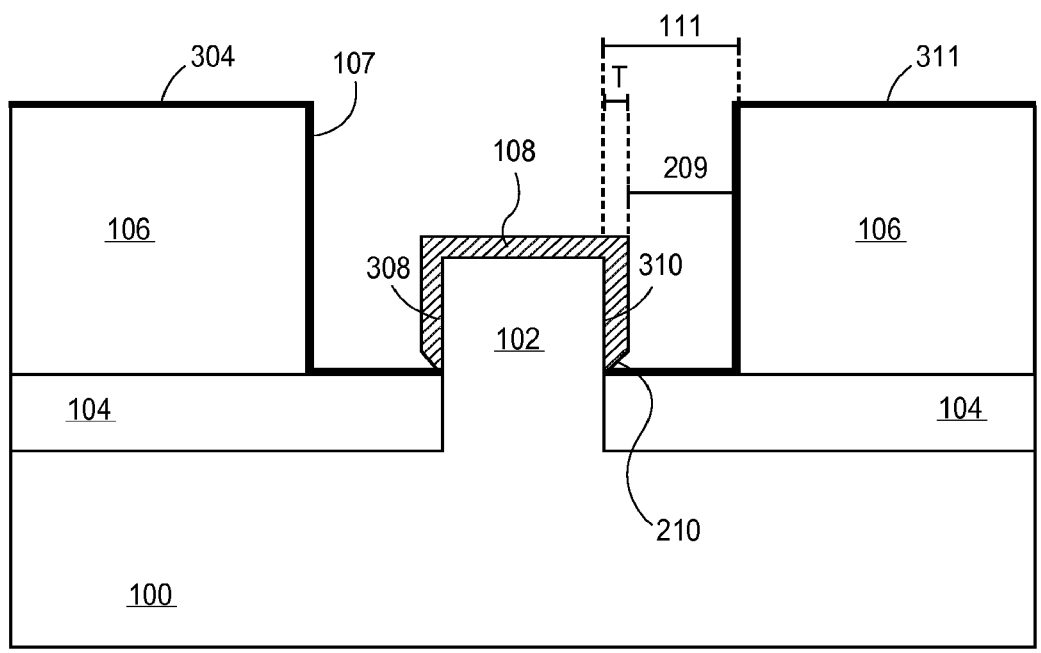

Following deposition of the high-K gate dielectric 108, as observed in FIG. 3E, the sacrificial blocking layer 302 is removed. In an embodiment, the sacrificial blocking layer 302 is removed by thermal treatment. For instance, the sacrificial blocking layer 302 may be thermally decomposed from exposure to the decomposition temperature of the sacrificial blocking layer 302. The decomposition temperature may include temperatures greater than 200° C. In an embodiment, the sacrificial blocking layer 302 thermally decomposes at a temperature between 200 to 400° C. Thermal decomposition is when the bonds of the molecule that form the sacrificial blocking layer 302 are broken, thereby causing the sacrificial blocking layer 302 to fall apart and separate from oxide surfaces to which they were attached. Alternatively, the sacrificial blocking layer 302 may be removed by chemical treatment. For instance, the sacrificial blocking layer 302 may be removed by a chemical treatment that preferentially removes the sacrificial blocking layer 302 relative to any other layer. That is, the chemical treatment may substantially remove the sacrificial blocking layer 302 and may not substantially remove any other material and/or layer. In embodiments, the chemical treatment includes treatment of a base solution containing tetramethylammonium hydroxide (TMAH). In an embodiment, the base solution contains 2% to 3% TMAH. In a particular embodiment, the base solution contains approximately 2.38% TMAH.

In an embodiment, a molecular fragment layer 311 may remain on surfaces upon which the sacrificial blocking layer 302 was previously formed. The molecular fragment layer 311 may be formed of dangling bonds containing specific atoms. In an embodiment, the molecular fragment layer 311 includes phosphorous atoms. In an embodiment, the molecular fragment layer 311 includes carbon atoms. Further, in an embodiment, the molecular fragment layer 311 includes oxygen atoms that were not originally part of the isolating layer 106. Still further, in an embodiment, the molecular fragment layer 311 includes nitrogen, sulfur, silicon, and/or chlorine. The structure of the molecular fragment layer 311 is discussed further herein with respect to FIGS. 5B-5D.

In embodiments, the high-K gate dielectric 108 can withstand temperatures greater than the temperature at which the sacrificial blocking layer thermally decomposes. As a result, the high-K gate dielectric 108 may remain on the surfaces 306, 308, and 310 of the fin 102 following thermal treatment.

The ends 210 of the high-K gate dielectric 108 may have a unique profile. For instance, the ends 210 may be a surface that is not perpendicular to the sidewalls 308 and 310. In an embodiment, the ends 210 are curved or tapered. For instance, the high-K gate dielectric 108 may gradually become thinner toward the farthest ends of the high-K gate dielectric 108. In an embodiment, the outer surface of the high-K gate dielectric 108 slopes toward the fin 102 to produce the gradual thinning of the high-K gate dielectric 108. The ends 210 may be formed at or proximate to the corner between the fin 102 and the STI 104. Accordingly, the ends 210 may be disposed immediately above, yet physically separated from, the STI 104.

Because the high-K gate dielectric 108 is not formed on the isolation sidewall 107, the space 209 between the high-K gate dielectric 108 and the isolation sidewall 107 is only one high-K gate dielectric thickness T less than the space 111 between the fin 102 and the isolation sidewall 107. Accordingly, the space 209 may be increased by one thickness T, e.g., approximately 2 nm, from that of conventional methods. The additional space may enable gate end cap scaling as well as allow subsequent processes to more easily fill the space 209 with workfunction metals and metal fill material, as will be discussed further herein. The additional space may also enable the reduction of gate length to minimize transistor size and increase transistor density. The gate length may be a dimension perpendicular to the plane of the page, i.e., the gate length runs in the direction that extends into and out of the page.

Although FIGS. 3C-3E illustrate the high-K gate dielectric 108 being formed only on the fin 102, embodiments are not so limited. For instance, the high-K gate dielectric 108 may also be formed on the top surfaces 312 of the STI 104 as illustrated in the embodiment depicted in FIGS. 4A-4C.

Figure 4A:
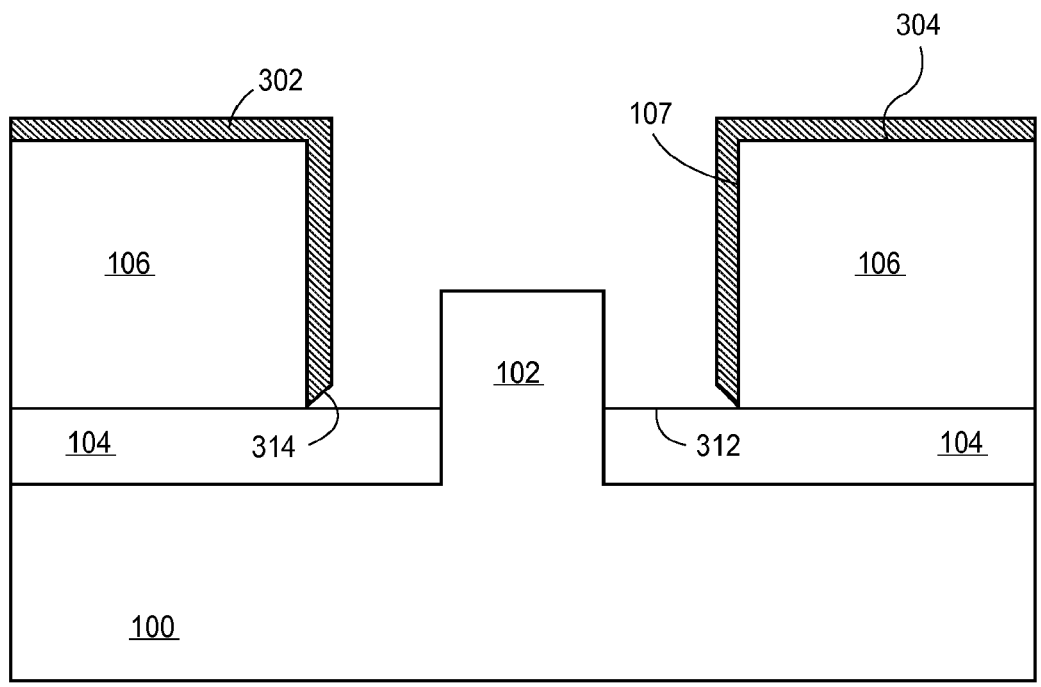
Figure 4B:
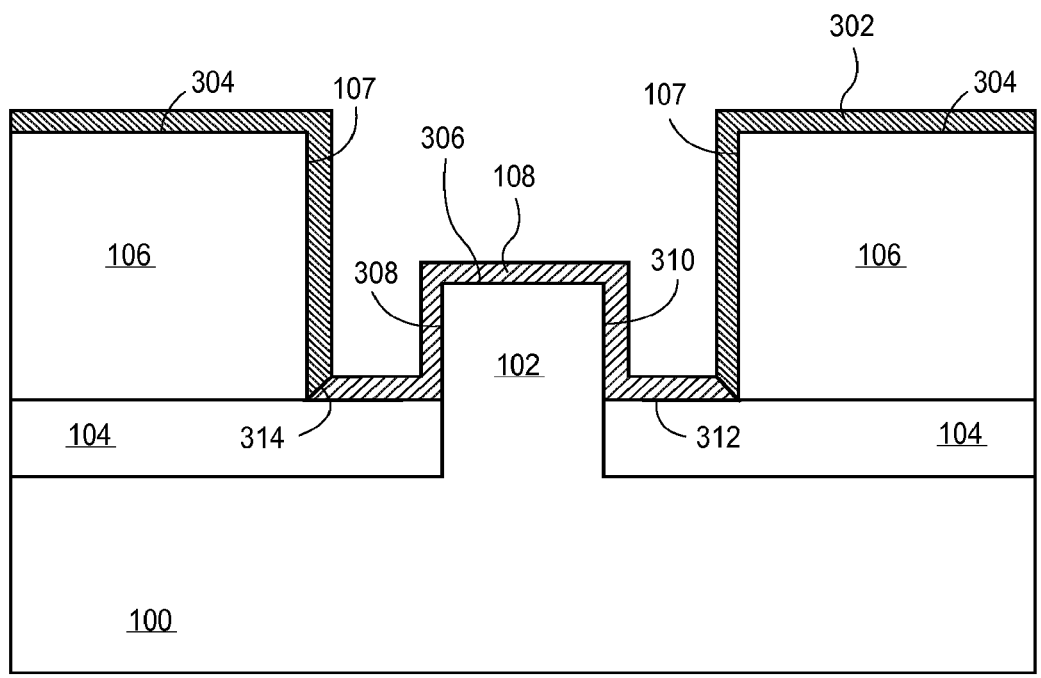

FIGS. 4A-4C illustrate an exemplary embodiment where the high-K gate dielectric 108 is formed not only on the fin 102, but also on portions of the STI 104. FIGS. 4A-4C continue the method of forming a semiconductor device from FIG. 3A. Specific details of the method regarding materials and process techniques may be referenced in corresponding descriptions already discussed herein with respect to FIGS. 3C-3E.

FIG. 4A illustrates the sacrificial blocking layer 302 deposited on the structure illustrated in FIG. 3A. Instead of forming the sacrificial blocking layer 302 on the isolation layer 106 and the STI 104, the sacrificial blocking layer 302 may be selectively deposited on only the isolation layer 106. Accordingly, the sacrificial blocking layer 302 may be formed on the isolation layer 106 but not on the STI 104. This may occur when the STI 104 are formed of a material different from that of the isolation layer 106 such that the sacrificial blocking layer 302 is selectively deposited on only the isolation layer 106. Accordingly, the sacrificial blocking layer 302 may have a unique end 314 disposed at corners between the isolation layer 106 and the STI 104.

As shown in FIG. 4B, the high-K gate dielectric 108 is then deposited on the surfaces 306, 308, and 310 of the fin 102, as well as the top surfaces 312 of the STI 104. The high-K gate dielectric 108 is formed on the top surface 312 because the sacrificial blocking layer 302 is not formed over the top surface 312. As such, the high-K gate dielectric 108 is not blocked from being formed on the top surface 312.

Thereafter, in FIG. 4C, the sacrificial blocking layer 302 is thermally decomposed by a thermal treatment. The thermal treatment may remove the sacrificial blocking layer 302 from the surfaces of the isolation layer 106, such as top surfaces 304 and the isolation sidewalls 107. In embodiments, portions of the high-K gate dielectric 108 may be disposed on portions of the STI 104. In an embodiment, the resulting high-K gate dielectric 108 has ends 210 that are formed at the corner between the isolation layer 106 and the STI 104. In a particular embodiment, the ends 210 are adjacent to the isolation sidewalls 107. The ends 210 may be have unique profiles that correspond with the profiles of the unique ends 314, or may have normal profiles that are perpendicular to the top surface 312 of the STI 104. In an embodiment, the high-K gate dielectric 108 does not make contact with the isolation sidewall 107 of the isolation layer 106. The sacrificial blocking layer 302 prevents the high-K gate dielectric 108 from coming in contact with the isolation layer 106.

As already mentioned herein, thermally decomposing the sacrificial blocking layer 302 breaks the bonds that form its molecular structure. A molecular fragment layer 311 may remain on the surfaces to which the sacrificial blocking layer 302 was previously attached. In embodiments, the molecule may be broken at different locations within the molecule, which is discussed herein with respect to FIGS. 5A-5D.

FIGS. 5A-5D illustrate molecular diagrams of a sacrificial blocking layer 302 formed as a SAM. Specifically, FIG. 5A illustrates a single, completely intact molecule of the SAM, and FIGS. 5B-5D illustrate various arrangements of dangling bonds that form the molecular fragment layer 311, which may remain on the surface (e.g., sidewall 107) of the isolation layer 106 following thermal decomposition. Although FIGS. 5A-5D illustrate the dangling bonds on the sidewall 107, dangling bonds remaining on any surface to which the sacrificial blocking layer 302 was previously attached are envisioned herein as well. For instance, the surface may be the top surface 304 of the isolation layer 106 or the top surface 312 of the STI 104.

As observed in FIG. 5A, an intact molecule 500 is anchored to the isolation layer 106. It is to be appreciated that the sidewall 107 of the isolation layer 106 is drawn facing upward for ease of illustration. One skilled in the art would understand that the molecule 500 may extend laterally from the isolation sidewall 107 when the molecule 500 is observed in its actual position. Additionally, although FIGS. 5A-5D illustrate the molecule 500 on the isolation sidewall 107, embodiments where the molecule is anchored on any other surface of the isolation layer 106, such as the top surface 304, are also contemplated herein.

In embodiments, molecule 500 includes a head group 502 and a tail 504. The head group 502 anchors to the isolation sidewall 107. In an embodiment, the isolation layer 106 and isolation sidewall 107 are formed of a metal oxide, such as HfO2. Accordingly, the head group 502 may be formed of any suitable atomic structure capable of attaching to the metal oxide. In an embodiment, the head group 502 is formed of a phosphorous atom (P) attached to oxygen atoms (O) that stem from the isolation layer 106. The O atoms may be attached to metal atoms (not shown) within the isolation layer 106. Accordingly, the main bond that forms the head group 502 may involve a metal-oxide-phosphorous (M-O—P) bond. In an embodiment, the P atom links the O atoms with the tail group 504. Although FIG. 5A illustrates the head group 502 being formed of a main bond involving M-O—P, any other suitable main bond may be used to preferentially attach the tail 504 to the isolation sidewall 107. For instance, a nitrogen (N)-based head group may be used such that the head group 502 includes N instead of P. Additionally, in embodiments where ODTCS is used to form the sacrificial blocking layer 302, the head group may contain silicon (Si) and/or chlorine (Cl) instead of P.

Generally, the size of the molecule 500 is highly dependent upon the size of the tail 504. For example, a molecule with a longer tail is larger than a molecule with a shorter tail. As illustrated in FIG. 5A, the tail 504 may be a long tail formed of an N amount of atoms that extend away from an anchoring surface. For instance, the tail 504 may be formed of at least 12 backbone atoms that extend away from the isolation sidewall 107. In an embodiment, the tail 504 is formed of approximately 18 backbone atoms. The tail may be formed of any suitable atom that is able to bond with another identical atom to form a large molecule. For instance, the tail 504 may be formed of carbon atoms. The large size of the molecule 500 prevents deposition of oxide materials upon the isolation sidewall 107.

Following thermal decomposition, the bonds that form the intact molecule 500 may break in different locations within the molecule 500 to form a residual layer, such as the molecular fragment layer 311. As illustrated in the exemplary embodiment of FIG. 5B, the molecule 500 may break at a bond within the tail 504, which thereby results in a dangling molecule, such as a methyl group that contains a carbon atom bonded to three hydrogen atoms, or a methylene group that contains a carbon atom bonded to two hydrogen atoms (not shown). Accordingly, carbon atoms may be disposed on the surfaces of the isolation sidewall 107. Alternatively, thermal decomposition may break the P—C bond between the head group 502 and the tail 504, as illustrated in FIG. 5C. In such instances, the isolation sidewall 107 may have a dangling phosphorous atom P or a molecule containing P. As aforementioned herein, embodiments where the sacrificial blocking layer 302 is formed of other suitable molecules that do not contain P may contain atoms such as N, S, Si, and Cl instead. In an alternative embodiment illustrated in FIG. 5D, the O—P bonds within the head group 502 may break following thermal decomposition. As a result, the isolation sidewall 107 may include a dangling molecule containing oxygen (O), such as a hydroxyl (OH). In embodiments, any combination of the dangling molecules discussed herein may be disposed on a surface of the isolation layer 106. For instance, a methyl group, a molecule containing phosphorous, and/or a hydroxyl may be disposed within the molecular fragment layer 311 following thermal decomposition.

Figure 6:
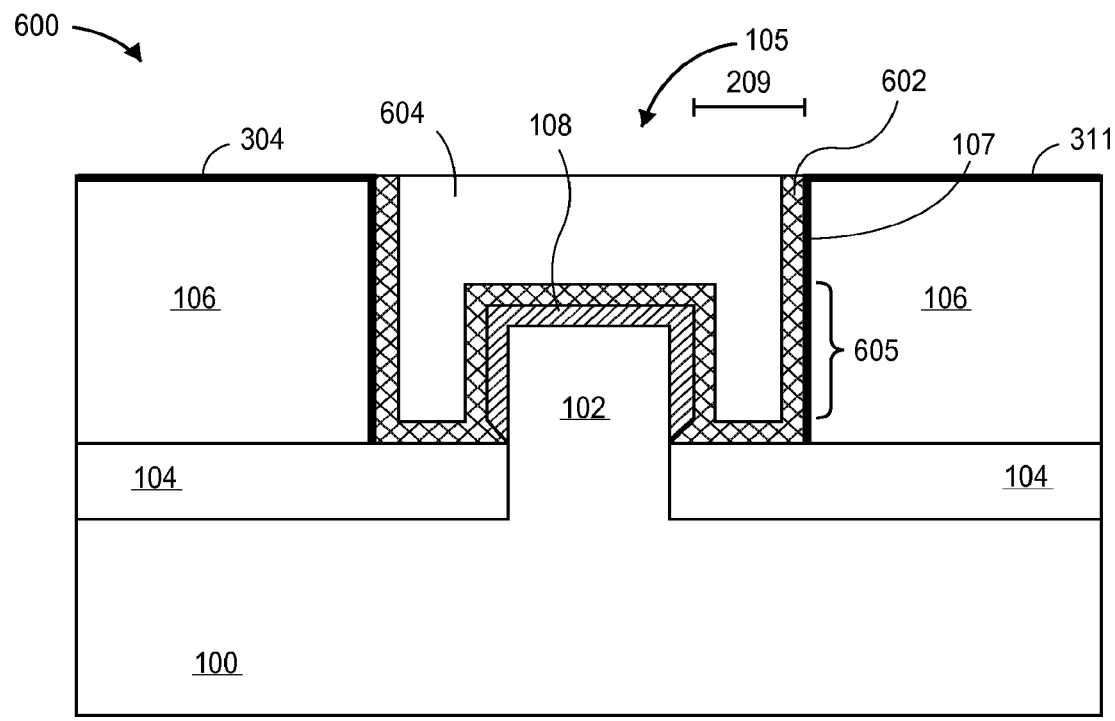
FIG. 6 illustrates a cross-sectional view of a non-planar finFET transistor formed in accordance with an embodiment of the invention.

After thermally decomposing the sacrificial blocking layer 302, subsequent gate layers may be deposited into the window 105 and within the spaces 209 to form a semiconductor device, such as a tri-gate finFET transistor 600 as shown in FIG. 6. For instance, a gate electrode layer including a workfunction metal layer 602 and a metal fill layer 604 may be deposited into the window 105. Workfunction metal 602 may be conformally deposited on the high-K gate dielectric 108 and on exposed regions of the STI 104 and isolation layer 106. The metal fill layer 604 may be subsequently deposited over the layer of workfunction metal 602. In an embodiment, the workfunction metal 602 is disposed directly on the isolation sidewall 107. In some embodiments, the molecular fragment layer 311 may be disposed between the workfunction metal 602 and the isolation sidewall 107. Accordingly, the workfunction metal 602 may be disposed directly on the molecular fragment layer 311. The metals 602 and 604 may be deposited by any suitable method, such as, but not limited to, sputtering or ALD. Thereafter, the top of the transistor 600 may be planarized to the top surface 304 of the isolation layer 106 by a planarization process, e.g., chemical-mechanical planarization (CMP).

Workfunction metal layer 602 may be either a P-type workfunction metal or N-type workfunction metal, depending on whether the transistor is to be a PMOS or an NMOS transistor. For a PMOS transistor, metals that may be used for the gate electrode include, but are not limited to, ruthenium, palladium, platinum, cobalt, nickel, and conductive metal oxides, e.g., ruthenium oxide. A P-type metal layer enables the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer enables the formation of an NMOS gate electrode with a workfunction that is between about 3.9 eV and about 4.2 eV. Metal fill layer 604 may be any suitable conductive material, such as tungsten.

Preventing high-K gate dielectric 108 from forming on the isolation sidewalls 107 enables the space 209 to be larger than spaces 109 formed by conventional methods as aforementioned herein with respect to FIG. 1. Although the molecular fragment layer 311 may be disposed within the space 209 in some embodiments, its thickness may be negligible and may not significantly decrease the space 209. Enlarging the space 209 enables the metals 602 and 604 to more easily fill the window 604, especially within high aspect ratio portions 605 of the window 105. For instance, spaces 209 allow more lateral space within which deposition material may travel to form on the top surfaces 312 of the STI 104. Accordingly, the probability of pinch-off and void formation may be significantly reduced. Enlarging the space 209 also enables gate end cap scaling. The extra space provides room for the gate end cap to be formed with different dimensions.

Figure 7:
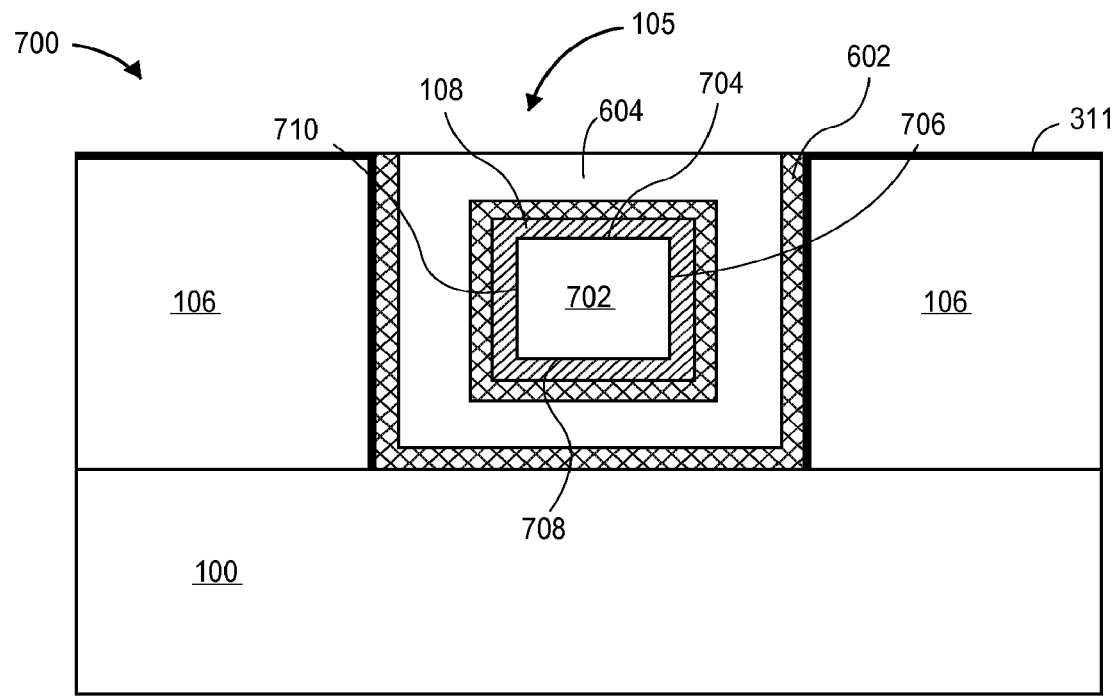
FIG. 7 illustrates a cross-sectional view of a gate-all-around nanowire transistor formed in accordance with an embodiment of the invention.

In addition to tri-gate finFET transistors, methods disclosed herein may be applicable to other non-planar devices, such as gate-all-around nanowire transistors 700 as illustrated in FIG. 7. Nanowire transistors 700 may include a semiconductor structure 702 disposed above, and physically separated from, a substrate 100. The semiconductor structure 702 may be a nanowire with a top surface 704, bottom surface 708, and sidewalls 706 and 710. High-K gate dielectric 108 may be disposed on surfaces 704, 706, 708, and 710 of the semiconductor structure 702. In embodiments, the high-K gate dielectric 108 is not disposed on the isolation sidewalls 107. Workfunction metal 602 may be disposed around exposed surfaces of the high-K gate dielectric 108 as well as on exposed surfaces of the substrate 100 and isolation sidewall 107. In an embodiment, the workfunction metal 602 is disposed directly on the isolation sidewall 107. In some embodiments, the molecular fragment layer 311 may be disposed between the workfunction metal 602 and the isolation sidewall 107. Accordingly, the workfunction metal 602 may be disposed directly on the molecular fragment layer 311. Metal fill material 604 may be formed on the workfunction metal 602 and fill the remaining area within the window 105. Accordingly, the channel regions may be formed proximate to the surfaces 704, 706, 708, and 710 of the semiconductor structure 702. In embodiments, the extra space around the semiconductor structure 702 allows the gate electrode to properly form around the entire semiconductor structure 702.

Figure 8:
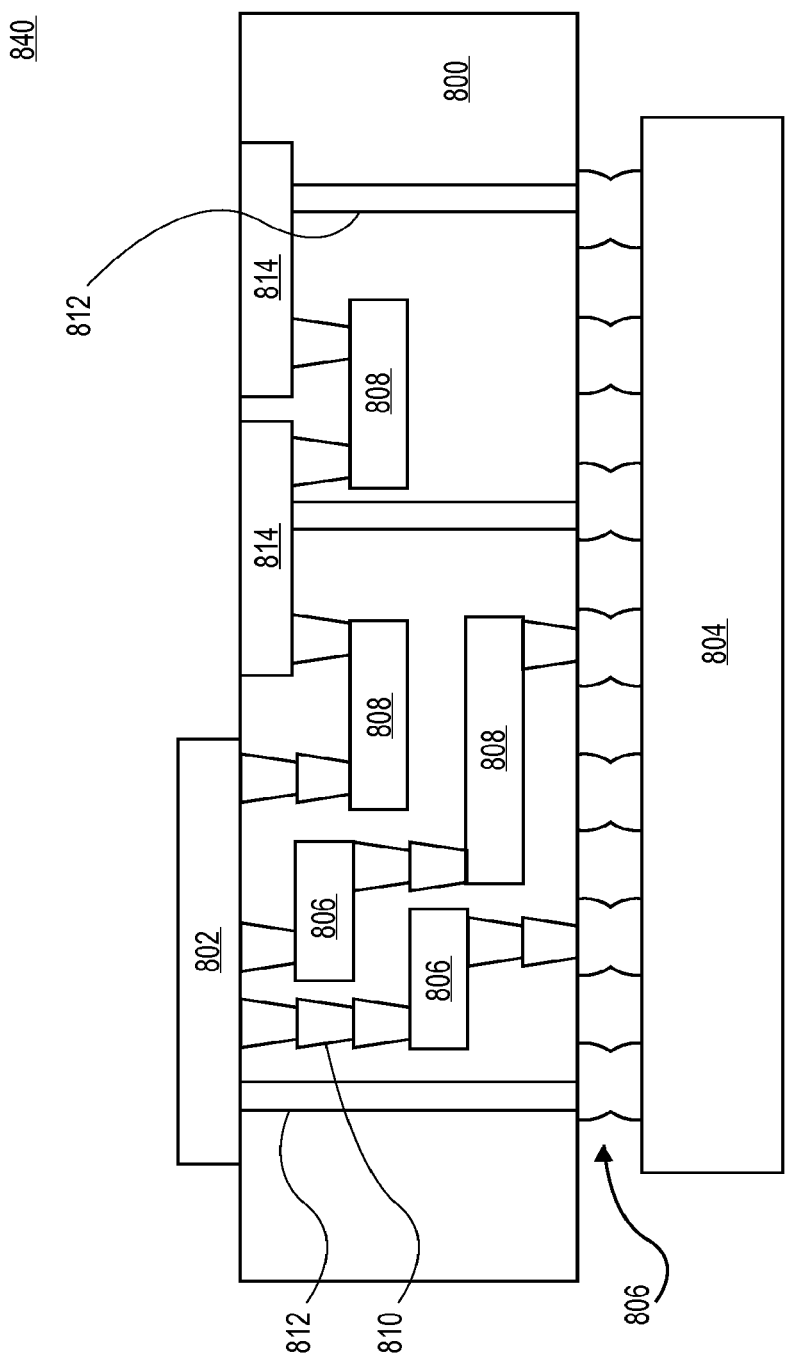
FIG. 8 illustrates an interposer implementing one or more embodiments of the invention.

FIG. 8 illustrates an interposer 800 that includes one or more embodiments of the invention. The interposer 800 is an intervening substrate used to bridge a first substrate 802 to a second substrate 804. The first substrate 802 may be, for instance, an integrated circuit die. The second substrate 804 may be, for instance, a memory module, a computer motherboard, or another integrated circuit die. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800.

In accordance with embodiments of the invention, apparatuses or processes disclosed herein may be used in the fabrication of interposer 800.

Figure 9:
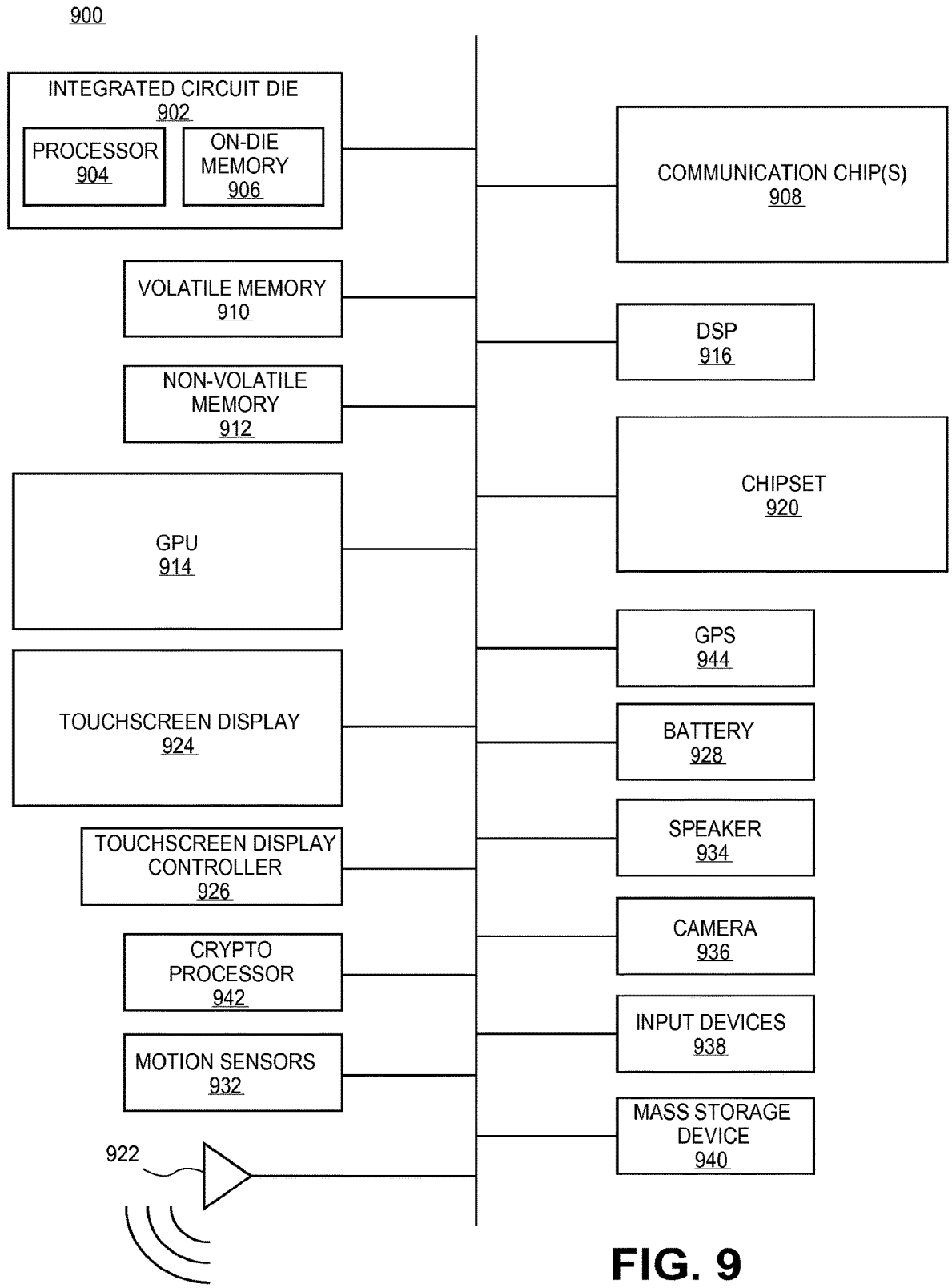
FIG. 9 illustrates a computing device built in accordance with an embodiment of the invention.

FIG. 9 illustrates a computing device 900 in accordance with one embodiment of the invention. The computing device 900 may include a number of components. In one embodiment, these components are attached to one or more motherboards. In an alternate embodiment, these components are fabricated onto a single system-on-a-chip (SoC) die rather than a motherboard. The components in the computing device 900 include, but are not limited to, an integrated circuit die 902 and at least one communication chip 908. In some implementations the communication chip 908 is fabricated as part of the integrated circuit die 902. The integrated circuit die 902 may include a CPU 904 as well as on-die memory 906, often used as cache memory, that can be provided by technologies such as embedded DRAM (eDRAM) or spin-transfer torque memory (STTM or STTM-RAM).

Computing device 900 may include other components that may or may not be physically and electrically coupled to the motherboard or fabricated within an SoC die. These other components include, but are not limited to, volatile memory 910 (e.g., DRAM), non-volatile memory 912 (e.g., ROM or flash memory), a graphics processing unit 914 (GPU), a digital signal processor 916, a crypto processor 942 (a specialized processor that executes cryptographic algorithms within hardware), a chipset 920, an antenna 922, a display or a touchscreen display 924, a touchscreen controller 926, a battery 928 or other power source, a power amplifier (not shown), a global positioning system (GPS) device 928, a compass 930, a motion coprocessor or sensors 932 (that may include an accelerometer, a gyroscope, and a compass), a speaker 934, a camera 936, user input devices 938 (such as a keyboard, mouse, stylus, and touchpad), and a mass storage device 940 (such as hard disk drive, compact disk (CD), digital versatile disk (DVD), and so forth).

The communications chip 908 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 908 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 908. For instance, a first communication chip 908 may be dedicated to shorter range wireless communications such as Wi-Fi and Bluetooth and a second communication chip 908 may be dedicated to longer range wireless communications such as GPS, EDGE, GPRS, CDMA, WiMAX, LTE, Ev-DO, and others.

The processor 904 of the computing device 900 includes one or more devices, such as a non-planar transistor or a gate-all-around nanowire transistor, that are formed by utilizing sacrificial blocking layers, in accordance with embodiments of the invention. The term "processor" may refer to any device or portion of a device that processes electronic data from registers and/or memory to transform that electronic data into other electronic data that may be stored in registers and/or memory.

The communication chip 908 may also include one or more devices, such as a non-planar transistor or a gate-all-around nanowire transistor, that are formed by utilizing sacrificial blocking layers, in accordance with embodiments of the invention.

In further embodiments, another component housed within the computing device 900 may contain one or more devices, such as a non-planar transistor or a gate-all-around nanowire transistor, that are formed by utilizing sacrificial blocking layers, in accordance with embodiments of the invention.

In various embodiments, the computing device 900 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

In an embodiment, a semiconductor device includes a semiconductor structure disposed above a semiconductor substrate, an isolation sidewall disposed beside the semiconductor structure and above the semiconductor substrate, and a high-K dielectric layer disposed directly on more than one side of the semiconductor structure and not disposed on the isolation sidewall. The semiconductor device may further include a gate electrode disposed on the high-K dielectric layer and on a portion of the isolation sidewall. Additionally, the semiconductor device may further include a molecular fragment layer disposed between the gate electrode and the isolation layer.

The molecular fragment layer may include a dangling bond formed of at least one of a phosphorous, carbon, oxygen, nitrogen, sulfur, silicon, or chlorine atom. In an embodiment, the semiconductor structure is a fin that extends upward from the semiconductor substrate. The more than one side may include a top surface of the fin and a portion of each sidewall of the fin. The semiconductor device may further include a shallow trench isolation (STI) disposed directly on top of the semiconductor substrate. In an embodiment, the high-K dielectric layer includes tapered or rounded ends disposed immediately above the STI, the high-K dielectric layer does not contact the STI. The high-K dielectric layer may also be disposed on the STI. In an embodiment, the high-K dielectric layer includes tapered or rounded ends disposed adjacent to the isolation sidewall, the high-K dielectric layer does not contact the isolation sidewall. The semiconductor structure may be a separate structure disposed above the semiconductor substrate. In an embodiment, the more than one sides includes a top, bottom, and side surfaces of the separate structure.

In an embodiment, a method of forming a semiconductor device includes providing a semiconductor structure disposed above a semiconductor substrate, the semiconductor structure disposed beside an isolation sidewall; depositing a sacrificial blocking layer on at least the isolation sidewall, exposing the semiconductor structure; depositing a high-K dielectric layer on the semiconductor structure; and removing the sacrificial blocking layer.

The sacrificial blocking layer may be a self-assembled monolayer (SAM). In an embodiment, the SAM is formed of molecules that are capable of blocking formation of the high-K dielectric layer on the isolation sidewalls. The molecules may be molecules selected from the group consisting of octadecylphophonic acide (ODPA), 1-octadecanethiol (ODT), octadecyltrichlorsilane (ODTCS), and stearic acid (ODCA). Removing the sacrificial blocking layer may include a thermal treatment or a chemical treatment. The thermal treatment may be performed at a decomposition temperature greater than a deposition temperature of the dielectric layer. In an embodiment, the decomposition temperature is between 200 to 400° C. The chemical treatment may include exposure to base solution comprising tetramethylammonium hydroxide (TMAH). In an embodiment, removing the sacrificial blocking layer results in a molecular fragment layer disposed on at least the isolation layer. The molecular fragment layer may include an atom selected from the group consisting of phosphorous, carbon, nitrogen, sulfur, silicon, and chlorine. Depositing the high-K dielectric layer may be performed at an oxide deposition temperature, wherein the oxide deposition temperature may be less than the decomposition temperature of the sacrificial blocking layer. In an embodiment, the sacrificial blocking layer is between 1 to 2 nm thick.

In an embodiment, a computing device includes a motherboard; a processor mounted on the motherboard; and a communication chip fabricated on the same chip as the processor or mounted on the motherboard. The processer may include a semiconductor structure disposed above a semiconductor substrate, a shallow trench isolation (STI) disposed directly on top of the semiconductor substrate, an isolation sidewall disposed beside the semiconductor structure and on the STI, and a high-K dielectric layer disposed directly on more than one side of the semiconductor structure and not on the isolation sidewall.

The semiconductor structure may be a fin that extends upward from the semiconductor substrate. In an embodiment, the computing device further includes a shallow trench isolation (STI) disposed directly on top of the semiconductor substrate. The high-K dielectric layer may include tapered or rounded ends disposed immediately above the STI, the high-K dielectric layer does not contact the STI. In an embodiment, the computing device may further include a gate electrode disposed on the high-K dielectric layer and on a portion of the isolation sidewall. The computing device may include a molecular fragment layer disposed between the gate electrode and the isolation layer.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

What is claimed is:

1. A semiconductor device, comprising:
   a semiconductor structure disposed above a semiconductor substrate;
   an isolation structure comprising an isolation sidewall disposed beside the semiconductor structure and above the semiconductor substrate, the isolation structure having a top surface;
   a high-K dielectric layer disposed directly on more than one side of the semiconductor structure and not disposed along the isolation sidewall;
   a gate electrode disposed on the high-K dielectric layer and along the isolation sidewall; and
   a molecular fragment layer disposed between the gate electrode and the isolation sidewall, wherein the molecular fragment layer is directly on the isolation sidewall and is directly on the top surface of the isolation structure.

2. The semiconductor device of claim 1, further comprising:
   a shallow trench isolation (STI) disposed directly on top of the semiconductor substrate.

3. The semiconductor device of claim 2, wherein the high-K dielectric layer is also disposed on the STI.

4. The semiconductor device of claim 2, wherein the molecular fragment layer is also disposed on the STI.

5. The semiconductor device of claim 4, wherein the molecular fragment layer is further disposed between the gate electrode and the STI.

6. The semiconductor device of claim 1, wherein the high-K dielectric layer comprises a metal.

7. The semiconductor device of claim 1, wherein the semiconductor structure is a fin that extends upward from the semiconductor substrate.

8. The semiconductor device of claim 7, wherein the more than one side includes a top surface of the fin and a portion of each sidewall of the fin.

9. The semiconductor device of claim 1, wherein the semiconductor structure is a nanowire disposed above the semiconductor substrate.

10. The semiconductor device of claim 9, wherein the more than one side includes a top surface of the nanowire, sidewall surfaces of the nanowire, and a bottom surface of the nanowire, the bottom surface opposite the top surface, and the sidewall surfaces between the top surface and the bottom surface.

11. The semiconductor device of claim 1, wherein the isolation sidewall comprises gate spacers.

12. A computing device, comprising: a board; and a component coupled to the board, the component including an integrated circuit structure, comprising:
    a semiconductor structure disposed above a semiconductor substrate; a structure comprising an isolation sidewall disposed beside the semiconductor structure and above the semiconductor substrate, the isolation structure having a top surface; a high-K dielectric layer disposed directly on more than one side of the semiconductor structure and not disposed along the isolation sidewall; a gate electrode disposed on the high-K dielectric layer and along the isolation sidewall; and a molecular fragment layer disposed between the gate electrode and the isolation sidewall, wherein the molecular fragment layer is directly on the isolation sidewall and is directly on the top surface of the isolation structure.

13. The computing device of claim 12, further comprising:
    a memory coupled to the board.

14. The computing device of claim 12, further comprising:
    a communication chip coupled to the board.

15. The computing device of claim 12, further comprising:
    a camera coupled to the board.

16. The computing device of claim 12, further comprising:
    a battery coupled to the board.

17. The computing device of claim 12, further comprising:
    an antenna coupled to the board.

18. The computing device of claim 12, wherein the component is a packaged integrated circuit die.

19. The computing device of claim 12, wherein the component is selected from the group consisting of a processor, a communications chip, and a digital signal processor.

* * * * *